United States Patent
Lee et al.

(10) Patent No.: US 9,668,348 B2
(45) Date of Patent: May 30, 2017

(54) MULTI-TERMINAL ELECTRONIC COMPONENT, METHOD OF MANUFACTURING THE SAME, AND BOARD HAVING THE SAME

(71) Applicant: SAMSUNG ELECTRO-MECHANICS CO., LTD., Suwon-Si, Gyeonggi-Do (KR)

(72) Inventors: Jae Hoon Lee, Suwon-Si (KR); Jung Min Nam, Suwon-Si (KR); Young Key Kim, Suwon-Si (KR); Hae In Kim, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 118 days.

(21) Appl. No.: 14/672,040

(22) Filed: Mar. 27, 2015

(65) Prior Publication Data

US 2016/0099093 A1 Apr. 7, 2016

(30) Foreign Application Priority Data

Oct. 6, 2014 (KR) .......... 10-2014-0134544

(51) Int. Cl.
*H01C 1/012* (2006.01)
*H05K 1/18* (2006.01)
*H01C 1/142* (2006.01)
*H05K 1/11* (2006.01)

(52) U.S. Cl.
CPC ............. *H05K 1/181* (2013.01); *H01C 1/012* (2013.01); *H01C 1/142* (2013.01); *H05K 1/111* (2013.01); *H05K 2201/10022* (2013.01); *H05K 2201/10636* (2013.01); *Y02P 70/611* (2015.11)

(58) Field of Classification Search
CPC ........ H01C 1/012; H01C 1/142; H01C 1/148; H01C 1/14; H01C 1/016
USPC .......................... 338/309, 313, 325, 327, 332
See application file for complete search history.

(56) References Cited

U.S. PATENT DOCUMENTS

| | | | | |
|---|---|---|---|---|
| 3,876,912 A | * | 4/1975 | Sanders | H01C 13/02 338/309 |
| 3,996,551 A | * | 12/1976 | Croson | H01C 7/006 216/16 |
| 5,179,366 A | * | 1/1993 | Wagner | H01C 1/084 338/308 |

(Continued)

FOREIGN PATENT DOCUMENTS

| | | |
|---|---|---|
| JP | 05-251202 A | 9/1993 |
| JP | 07-230905 A | 8/1995 |

(Continued)

*Primary Examiner* — Kyung Lee
(74) *Attorney, Agent, or Firm* — McDermott Will & Emery LLP (57) ABSTRACT

A multi-terminal electronic component includes: a base material; a resistance layer disposed on a surface of the base material; a first terminal and a second terminal disposed to be spaced apart from each other while covering portions of the resistance layer, respectively; and a third terminal disposed between the first terminal and the second terminal and covering a portion of the resistance layer, wherein first and second side surfaces of the base material opposing each other are exposed from the first through third terminals.

10 Claims, 7 Drawing Sheets

(56) References Cited

U.S. PATENT DOCUMENTS

| | | | | |
|---|---|---|---|---|
| 6,097,276 A | * | 8/2000 | Van Den Broek | H01C 7/06 |
| | | | | 338/22 R |
| 6,314,637 B1 | * | 11/2001 | Kimura | H01C 1/142 |
| | | | | 29/610.1 |
| 7,193,499 B2 | * | 3/2007 | Tsukada | H01C 1/144 |
| | | | | 338/309 |
| 8,081,059 B2 | * | 12/2011 | Tanimura | H01C 1/148 |
| | | | | 338/307 |
| 8,098,127 B2 | * | 1/2012 | Tchaplia | H01P 5/16 |
| | | | | 338/254 |
| 2009/0085716 A1 | * | 4/2009 | Kim | H01C 1/14 |
| | | | | 338/325 |
| 2013/0154790 A1 | | 6/2013 | Park et al. | |

FOREIGN PATENT DOCUMENTS

| | | |
|---|---|---|
| JP | 2007-049070 A | 2/2007 |
| KR | 10-2013-0070682 A | 6/2013 |

* cited by examiner

MULTI-TERMINAL ELECTRONIC COMPONENT, METHOD OF MANUFACTURING THE SAME, AND BOARD HAVING THE SAME

CROSS-REFERENCE TO RELATED APPLICATION

This application claims the priority and benefit of Korean Patent Application No. 10-2014-0134544 filed on Oct. 6, 2014, with the Korean Intellectual Property Office, the disclosure of which is incorporated herein by reference.

BACKGROUND

The present inventive concept relates to a multi-terminal electronic component, a method of manufacturing the same, and a board having the same.

A chip-shaped resistor is suitable for providing precision resistance, and serves to adjust a level of a current and drop a level of a voltage in a circuit.

In a case in which a defect, for example, a short-circuit, occurs due to a resistor being damaged by external impacts, for example, a power surge, a static discharge, or the like, in a circuit design using the resistor, an entire amount of current of a voltage may flow through an integrated circuit (IC), and thus, secondary damage may be incurred to a circuit.

In order to prevent such a phenomenon from occurring, a circuit design including a plurality of resistors may be proposed. However, such a circuit design problematically involves an inevitable increase in an amount of space required on a board.

In particular, in a case of a mobile device having reduced sizes and increased precision, since the increase in the amount of the space of the board is undesirable for stability of the circuit as described above, there is a need for research into a resistor capable of effectively adjusting a level of a current flowing in the circuit.

RELATED ART DOCUMENT

Korean Patent Laid-Open Publication No. 10-2013-0070682

SUMMARY

An aspect of the present inventive concept may provide a multi-terminal electronic component, a method of manufacturing the same, and a board having the same.

According to an aspect of the present inventive concept, a multi-terminal electronic component may include a first terminal and a second terminal disposed on a resistance layer; and a third terminal disposed between the first terminal and the second terminal, wherein first and second side surfaces of a base material opposing each other are exposed from the first through third terminals, thereby improving space utilization at the time of the mounting of the multi-terminal electronic component on a board.

The first through third terminals may not be disposed on the first and second side surfaces of the base material, and the first and second side surfaces of the base material may be entirely exposed.

According to another aspect of the present inventive concept, a board having a multi-terminal electronic component may include the multi-terminal electronic component as described above and a circuit board on which the multi-terminal electronic component is mounted, wherein the multi-terminal electronic component is a multi-terminal electronic component according to an exemplary embodiment of the present inventive concept, thereby improving space utilization at the time of the mounting of the multi-terminal electronic component on the circuit board.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Exemplary embodiments of the present inventive concept will now be described in detail with reference to the accompanying drawings.

The inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

As used herein, it will be further understood that the terms "include" and/or "have" when used in the present inventive concept, specify the presence of elements, but do not preclude the presence or addition of one or more other elements, unless otherwise indicated.

Further, in the present inventive concept, it will be understood that when an element is referred to as being formed "on" another element, it can be directly formed thereon or other intervening elements may be present.

In addition, in the present inventive concept, when an element is referred to as being "connected to," it may be "directly connected to" and may also be "indirectly connected to" while having intervening elements therebetween.

In the accompanied drawings, W, T, L directions refer to a width direction, a thickness direction, and a length direction of a base material, respectively.

Figure 1:
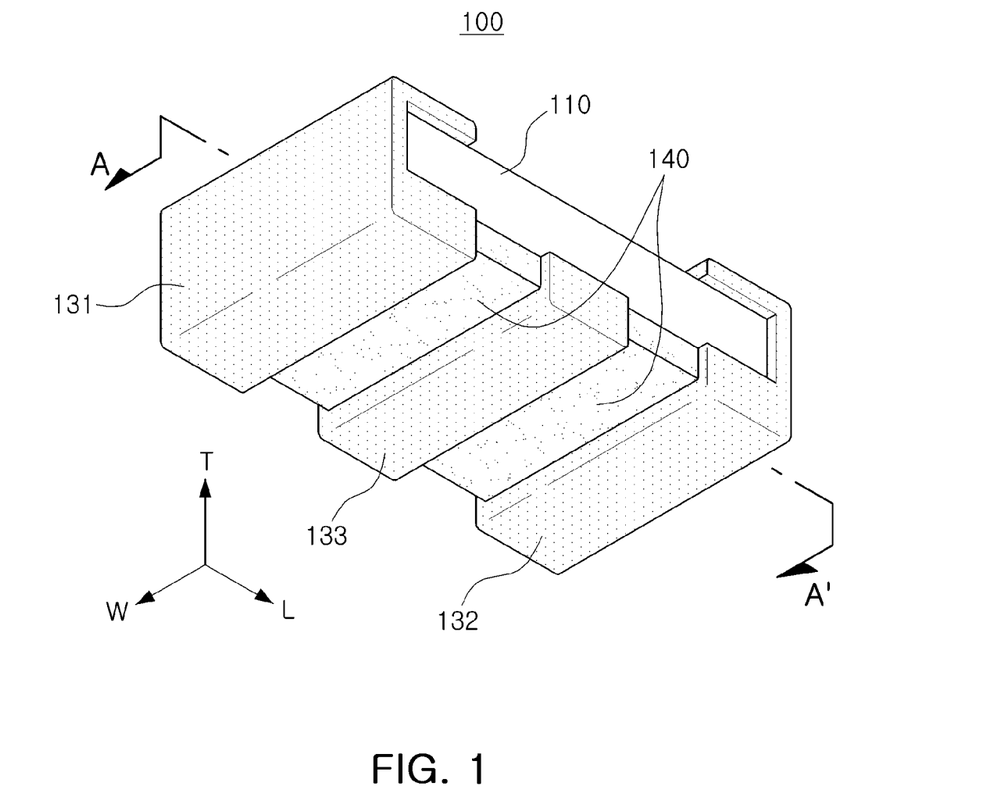
FIG. 1 is a perspective view of a multi-terminal electronic component according to an exemplary embodiment of the present inventive concept.
Figure 2:
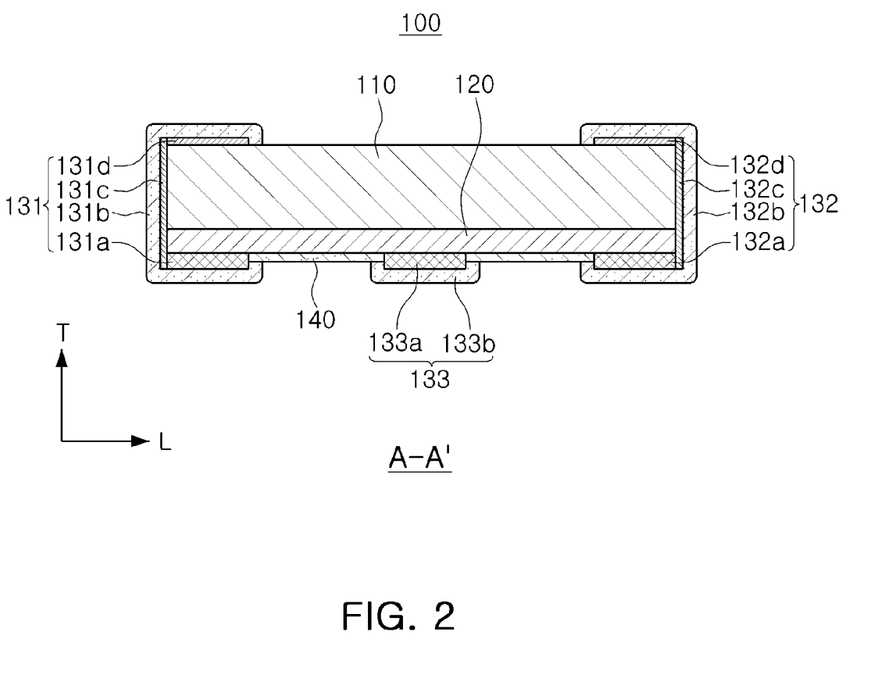
FIG. 2 is a cross-sectional view of FIG. 1 taken along line A-A'.

FIG. 1 is a perspective view of a multi-terminal electronic component 100 according to an exemplary embodiment of the present inventive concept; FIG. 2 is a cross-sectional view of FIG. 1 taken along line A-A'; and FIG. 3 is a lateral view of FIG. 1.

Figure 3:
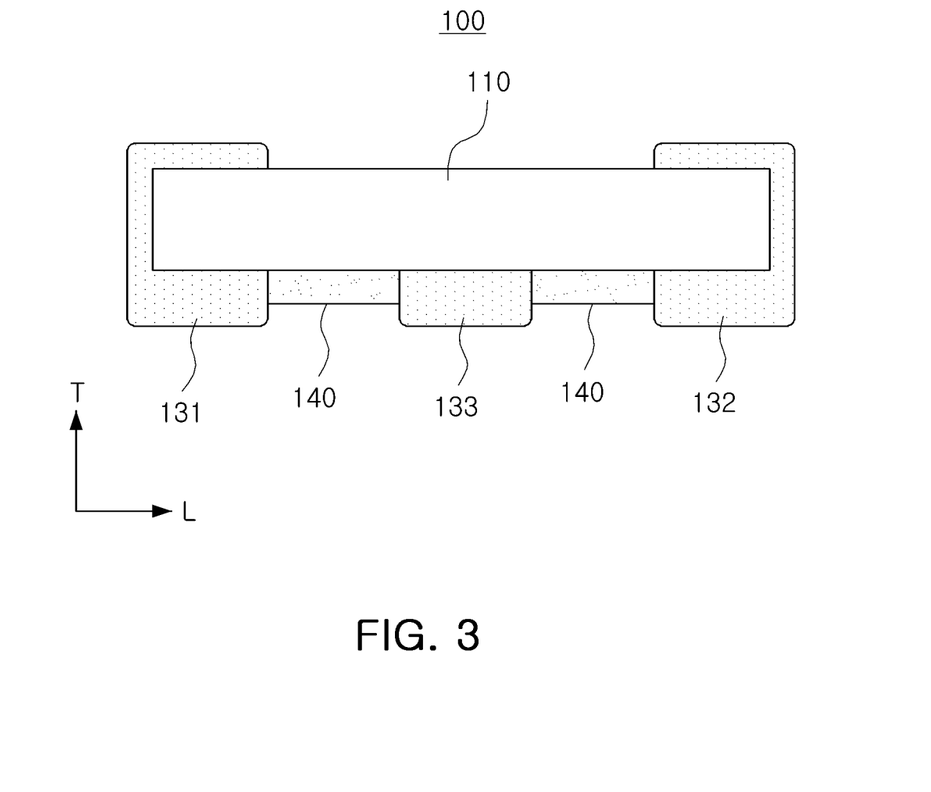
FIG. 3 is a lateral view of FIG. 1.

Referring to FIGS. 1 through 3, the multi-terminal electronic component 100 according to the exemplary embodiment of the present inventive concept may include a base material 110, a resistance layer 120, and first through third terminals 131, 132, and 133 disposed on the resistance layer 120.

The base material 110 may be used to support the resistance layer 120 and secure intensity of the multi-terminal electronic component 100 but is not particularly limited, and may include, for example, an aluminum (Al) substrate or an insulating substrate.

Although not limited hereto, the base material 110 may be provided as a thin plate type having a rectangular shape, and may be formed of an alumina material having a surface which is anodized and then insulated.

The base material 110 may be formed of a material having excellent thermal conductivity, thereby serving as a heat diffusion path for externally dissipating heat generated in the resistance layer 120 during the use of the multi-terminal electronic component 100.

The resistance layer 120 may be disposed on one surface of the base material 110 in a thickness direction of the base material 110, and may include a first resistor part connected to the first and third terminals 131 and 133 and forming resistance and a second resistor part connected to the second and third terminals 132 and 133 and forming resistance. The first resistor part and the second resistor part may be formed as an integral resistance layer as illustrated in FIG. 2.

Although not limited hereto, the resistance layer 120 may include silver (Ag), palladium (Pd), copper (Cu), nickel (Ni), a Cu—Ni based alloy, a nickel-chromium (Ni—Cr) based alloy, ruthenium oxide ($RuO_x$), silicon oxide ($SiO_x$), manganese (Mn), a Mn based alloy, and the like, as main components, and may include various materials based on a required resistance level.

According to the exemplary embodiment of the present inventive concept, the integrally formed single resistance layer 120 may include the first resistor part and the second resistor part, thereby improving space utilization as compared to a case in which the first resistor part and the second resistor part are separately formed.

The first resistor part may be formed between the first terminal 131 and the third terminal 133, and the second resistor part may be formed between the second terminal 132 and the third terminal 133. Accordingly, the first resistor part and the second resistor part may use the third terminal 133 as a common terminal to adjust a level of a current flowing into a circuit.

The circuit formed in a circuit board may use a resistor to adjust a level of a current. In order to prevent damage to the circuit due to the resistor being damaged by external impacts, for example, a power surge, a static discharge, or the like, two or more resistor elements may be used or an array resistor connected to a pair of terminals having resistor parts independently provided therein, respectively, may be used. However, in the case in which two or more resistor elements are used or a conventional array resistor is used, an issue of an increase in an amount of a mounting space may arise.

According to the exemplary embodiment of the present inventive concept, the multi-terminal electronic component 100 may include the three terminals 131, 132, and 133 and the two resistor parts disposed between the two terminals, and thus an amount of a space of the circuit board on which the resistor element is disposed may be reduced, as compared to the case of using two resistor elements each including a single resistor part or a case of using an array resistor connected to a pair of terminals having resistor parts independently provided therein, respectively, thereby improving space utilization and facilitating the miniaturization and the precision of a device using the resistor element.

That is, the multi-terminal electronic component 100 having a 3-terminal shape, which is configured of the single common third terminal 133 with respect to the two resistor parts and the two independent first and second terminals 131 and 132 connected to the first and second resistor parts, respectively, may be provided, and thus a single terminal may be substantially omitted, whereby the multi-terminal electronic component 100 having a reduced size may be manufactured using a scheme similar to an existing scheme.

The first and second resistor parts of the multi-terminal electronic component 100 according to the exemplary embodiment of the present inventive concept may determine a resistance level of one of the first and second resistor parts by continuously trimming one of the first and second resistors based on a resistance level the other of the first and second resistors determined through trimming.

As used herein, trimming refers to a process such as cutting for fine adjustment of a resistance level and may be a process of determining a resistance level set in each resistor part during circuit designing.

According to the exemplary embodiment of the present inventive concept, an error in a resistance level may be reduced as compared to the case in which two single resistor elements are used or an array resistor is used.

The multi-terminal electronic component 100 according to the exemplary embodiment of the present inventive concept may form the resistance layer 120 on one surface of the base material 110 in the thickness direction of the base material 110, may then form first through third electrode layers 131a, 132a, and 133a on the resistance layer 120, and may form the first through third terminals 131, 132, and 133 thereon, such that an area of the resistance layer 120 may be increased, as compared to a case in which an electrode layer is formed on a base material and then a resistance layer is formed to overlap a subsequent electrode layer.

According to the exemplary embodiment of the present inventive concept, power of the multi-terminal electronic component 100 may be increased due to the increase in the area of the resistance layer 120, and a distribution, which is non-uniform, of resistance levels may be improved due to being able to achieve uniformity among overlapping areas between the resistance layer 120 and each of the first through third electrode layers 131a, 132a, and 133a by disposing the first through third electrode layers 131a, 132a, and 133a on the resistance layer 120.

The first through third terminals 131, 132, and 133 may be formed to expose first and second side surfaces of the base material 110 opposing each other. The first and second side surfaces of the base material 110 refer to both side surfaces of the base material 110 opposing each other in a width direction of the base material 110.

Both side surfaces of the base material 110 opposing each other in the length direction of the base material 110 may be defined as third and fourth side surfaces of the base material 110.

According to the exemplary embodiment of the present inventive concept, a gap between the multi-terminal electronic component 100 to be mounted on the circuit board and an electronic component to be disposed adjacently to the multi-terminal electronic component 100 may be reduced at the time of the mounting of the multi-terminal electronic component 100 on the circuit board because the first through third terminals 131, 132, and 133 are not disposed on both side surfaces of the base material 110 in the width direction of the base material 110, whereby the first and second side surfaces of the base material 110 are exposed.

In particular, a gap between the multi-terminal electronic component 100 to be mounted on the circuit board and the electronic component to be disposed adjacently thereto in the width direction of the base material 110 may be reduced, and a short-circuit likely to occur between the circuit board and the adjacent electronic component may be reduced.

According to the exemplary embodiment of the present inventive concept, as illustrated in FIG. 3, the first and second side surfaces of the base material 110 may be entirely exposed because the first through third terminals 131, 132, and 133 are not disposed on both side surfaces of the base material 110 in the width direction of the base material 110.

The first through third terminals 131, 132, and 133 may include the first through third electrode layers 131a, 132a, and 133a disposed on the resistance layer 120, respectively, and may include first through third plating layers 131b, 132b, and 133b disposed on the first through third electrode layers 131a, 132a, and 133a, respectively.

For example, as illustrated in FIG. 2, the first terminal 131 may include the first electrode layer 131a and the first plating layer 131b, the second terminal 132 may include the second electrode layer 132a and the second plating layer 132b, and the third terminal 133 may include the third electrode layer 133a and the third plating layer 133b.

The first through third electrode layers 131a, 132a, and 133a may be disposed to be spaced apart from one another on a surface of the resistance layer 120 in a thickness direction of the resistance layer 120, and the third electrode layer 133a may be disposed between the first electrode layer 131a and the second electrode layer 132a.

Although not limited hereto, the first through third electrode layers 131a, 132a, and 133a may be formed through a scheme of coating a conductive paste for forming a conductive electrode on the resistance layer 120. The coating scheme may use a screen printing scheme, or the like.

The first through third electrode layers 131a, 132a, and 133a may be formed of materials different from those forming the above-described resistance layer 120, for example, Cu, Ni, Pd, or the like, or may use the same material as that forming the resistance layer 120 as necessary.

According to the exemplary embodiment of the present inventive concept, a pair of side electrodes 131c and 132c connected to the first and second electrode layers 131a and 132a, respectively, may be disposed on third and fourth side surfaces of a stacked structure, respectively, in which the base material 110, the resistance layer 120, and the first through third electrode layers 131a, 132a, and 133a are disposed. The first terminal 131 may include the first side electrode 131c connected to the first electrode layer 131a. The second terminal 132 may include the second side electrode 132c connected to the second electrode layer 132a.

Through this, the first terminal 131 may extend to the third side surface of the base material 110 perpendicular with respect to the first and second side surfaces of the base material 110, and the second terminal 132 may extend to the fourth side surface of the base material 110 opposing the third side surface of the base material 110.

The pair of side electrodes 131c and 132c may be formed through a process of sputtering a conductive material forming the side electrodes 131c and 132c on the third and fourth side surfaces of the stacked structure, respectively.

According to the exemplary embodiment of the present inventive concept, the first and second terminals 131 and 132 may selectively further include first and second reverse side electrodes 131d and 132d, respectively, disposed on the other surface of the base material 110 in the thickness direction of the base material 110, while opposing the first and second electrode layers 131a and 132a, respectively. In the case in which the first and second reverse side electrodes 131d and 132d are disposed on the other surface of the base material 110 in the thickness direction of the base material 110, the first and second electrode layers 131a and 132a and the first and second reverse side electrodes 131d and 132d may offset force applied to the base material 110 from the resistance layer 120 during a sintering process, whereby the base material 110 may be prevented from being bent due to the resistance layer 120.

Although not limited hereto, the first and second reverse side electrodes 131d and 132d may be formed by printing a conductive paste.

In the case in which the stacked structure includes the first and second reverse side electrodes 131d and 132d, the pair of side electrodes 131c and 132c may be disposed to be connected to the first electrode layer 131a and the first reverse side electrode 131d, and the second electrode layer 132a and the second reverse side electrode 132d, respectively.

According to the exemplary embodiment of the present inventive concept, a protection layer 140 for protecting the resistance layer 120 from external impacts may be disposed on a surface of the resistance layer 120 on which the first through third electrode layers 131a, 132a, and 133a are not disposed.

Although not limited hereto, the protection layer 140 may be formed of silicon dioxide ($SiO_2$) or a glass material, and may be formed on the resistance layer 120 through an overcoating scheme.

Dissimilar to the case in which the electrode layer is formed and then the resistance layer is formed, in the case of the exemplary embodiment of the present inventive concept in which the electrode layers 131a, 132a, and 133a are disposed on the resistance layer 120, although the protection layer 140 is disposed on the resistance layer 120, the first through third terminals 131, 132, and 133 may protrude further than the protection layer 140, whereby contact between the first through third terminals 131, 132, and 133 and electrode pads disposed on the circuit board may be facilitated at the time of the mounting of the multi-terminal electronic component 100 on the circuit board.

According to the exemplary embodiment of the present inventive concept, for the mounting of the multi-terminal electronic component 100 on the circuit board subsequently to forming the protection layer 140, the first through third plating layers 131b, 132b, and 133b may be formed on the first through third electrode layers 131a, 132a, and 133a, respectively.

According to the exemplary embodiment of the present inventive concept, in the case in which the multi-terminal electronic component 100 includes the first and second reverse side electrodes 131d and 132d and the side electrodes 131c and 132c, the first and second plating layers 131b and 132b may be formed on the first and second reverse side electrodes 131d and 132d and the side electrodes 131c and 132c.

For example, the first plating layer 131b may be formed to cover the first electrode layer 131a, the first reverse side electrode 131d, and the side electrode 131c connecting the first electrode layer 131a and the first reverse side electrode 131d to each other, and the second plating layer 132b may be formed to cover the second electrode layer 132a, the second reverse side electrode 132*d*, and the side electrode 132*c* connecting the second electrode layer 132*a* and the second reverse side electrode 132*d* to each other.

Figure 4:
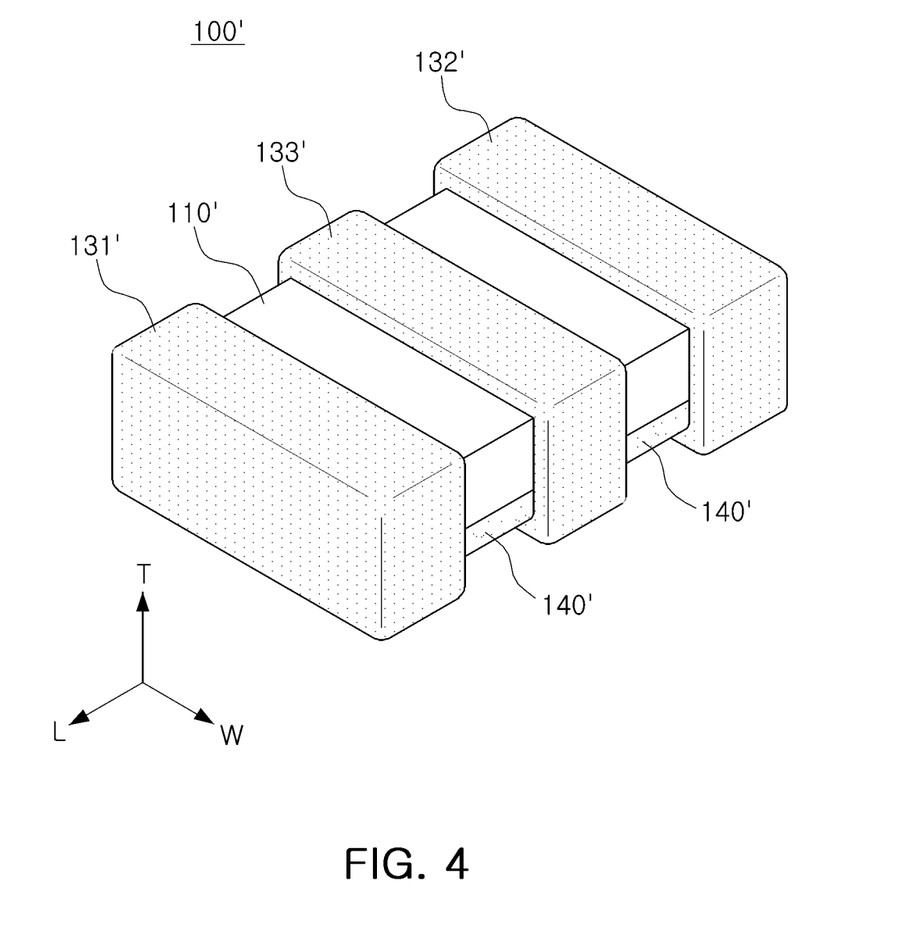
FIGS. 4 and 5 are perspective views of multi-terminal electronic components according to Comparative Examples, respectively.
Figure 5:
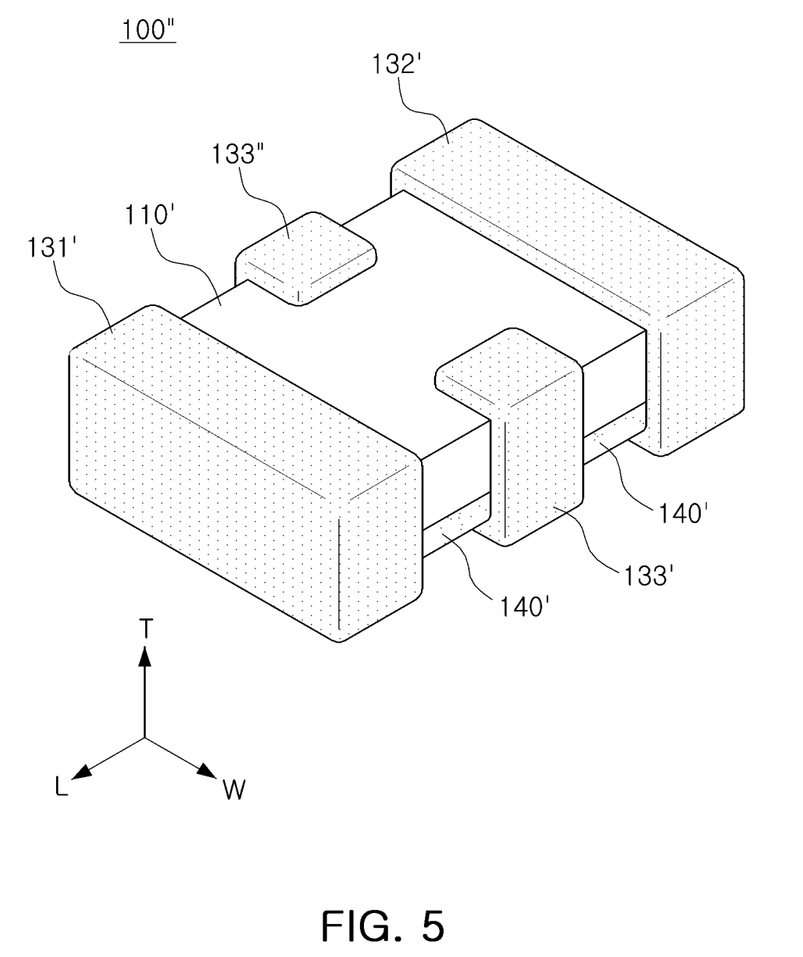

FIGS. 4 and 5 are perspective views of 3-terminal electronic components according to Comparative Examples, respectively.

In a case in which a terminal of an electronic component is formed through a dipping scheme or is formed by coating a paste on a roller and transferring the paste coated on the roller, as illustrated in FIGS. 4 and 5, terminals 131', 132', 133', and 133" may be disposed on side surfaces of a base material 110' in a width direction of the base material 110'.

In a case in which the first through third terminals 131', 132', 133', and 133" are disposed on the side surfaces of the base material 110' in the width direction of the base material 110' as illustrated in FIGS. 4 and 5, the electronic component may occupy a great amount of a space of a circuit board in the width direction of the base material 110' at the time of the mounting of the electronic component on the circuit board, whereby mounting density may be reduced.

In addition, in the case in which the terminals are disposed on the side surfaces of the base material 110' in the width direction of the base material 110', solders may climb along the terminals disposed on the side surfaces of the base material 110' in the width direction of the base material 110', respectively, which may result in an issue of an increase in a space of the circuit board necessary for disposing a single electronic component.

However, according to the exemplary embodiment of the present inventive concept, since the first through third terminals are not disposed on both side surfaces of the base material in the width direction of the base material, the gap between the multi-terminal electronic component according to the exemplary embodiment of the present inventive concept and electronic components to be disposed adjacently to both side surfaces of the multi-terminal electronic component in the width direction of the multi-terminal electronic component may be reduced at the time of the mounting of the multi-terminal electronic component on the circuit board, and a short-circuit likely to occur between the multi-terminal electronic component and the adjacent electronic components may be reduced.

Board 200 Having Multi-Terminal Electronic Component

Figure 6:
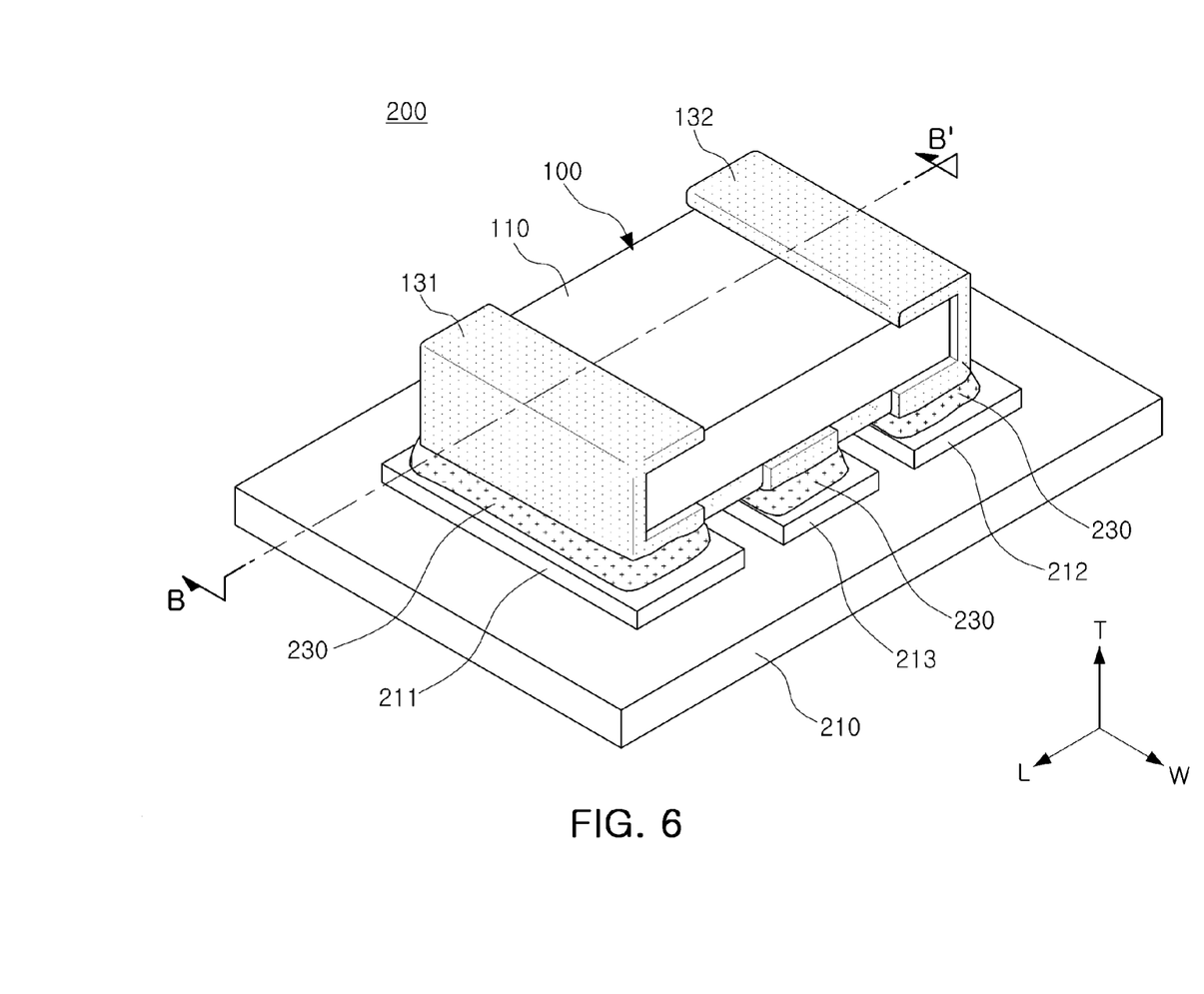
FIG. 6 is a perspective view of a board having a multi-terminal electronic component according to another exemplary embodiment of the present inventive concept.
Figure 7:
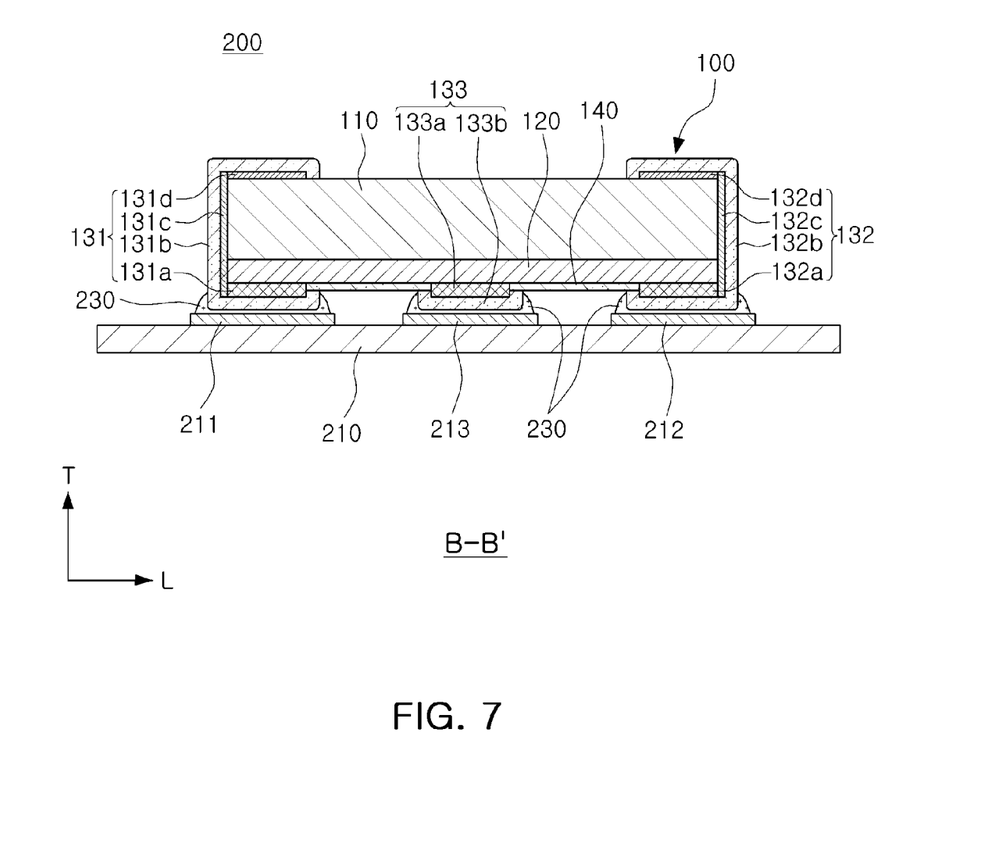
FIG. 7 is a cross-sectional view of FIG. 6 taken along line B-B'.

FIG. 6 is a perspective view of a board having a multi-terminal electronic component according to another exemplary embodiment of the present inventive concept; and FIG. 7 is a cross-sectional view of FIG. 6 taken along line B-B'.

Referring to FIGS. 6 and 7, a board 200 having the multi-terminal electronic component 100 according to the present exemplary embodiment may include the multi-terminal electronic component 100 and a circuit board 210 having an upper surface on which first through third electrode pads are disposed while being spaced apart from one another.

The multi-terminal electronic component 100 may include a base material, a resistance layer disposed on a surface of the base material in a thickness direction of the base material, a first terminal and a second terminal disposed to be spaced apart from each other while covering portions of the resistance layer, respectively, and a third terminal disposed between the first terminal and the second terminal and covering a portion of the resistance layer. First and second side surfaces of the base material may be exposed from the first through third terminals.

Since a description of the multi-terminal electronic component 100 is identical to that of the multi-terminal electronic component according to the exemplary embodiment of the present inventive concept described above, a detailed description thereof will be omitted herein.

The circuit board 210 may be a portion of the board 200 in which an electronic circuit is formed. For example, an integrated circuit (IC) for a predetermined operation or control of an electronic device may be formed in the circuit board 210, and thereby currents supplied from a separate power source may flow therein.

In this case, the circuit board 210 may include various wiring lines or may further include semiconductor devices of different types such as transistors. The circuit board 210 may be configured in various manners according to cases such as in a case of including a conductive layer or a dielectric layer.

The first through third electrode pads 211, 212, and 213 may be disposed to be spaced apart from one another on the circuit board 210, and may be connected to the first through third terminals of the multi-terminal electronic component, respectively.

The first through third terminals may be electrically connected to the electronic circuit through the first through third electrode pads 211, 212, and 213, such that a first resistor part and a second resistor part formed between the first through third terminals may be connected to the electronic circuit.

As set forth above, according to exemplary embodiments of the disclosure, the multi-terminal electronic component in which space utilization is excellent at the time of the mounting of the multi-terminal electronic component on the circuit board and a defect such as a short-circuit likely to occur between the multi-terminal electronic component and an adjacent electronic component is improved, the method of manufacturing the same, and the board having the same may be provided.

While exemplary embodiments have been illustrated and described above, it will be apparent to those skilled in the art that modifications and variations could be made without departing from the scope of the invention as defined by the appended claims.

What is claimed is:

1. A multi-terminal electronic component comprising:
   a base material;
   a resistance layer disposed on a surface of the base material;
   a first terminal and a second terminal disposed to be spaced apart from each other while covering portions of the resistance layer, respectively;
   a third terminal disposed between the first terminal and the second terminal and covering a portion of the resistance layer,
   wherein first and second side surfaces of the base material opposing each other are exposed from the first through third terminals; and
   a protection layer disposed on a surface of the resistance layer exposed from the first through third terminals,
   wherein the resistance layer includes a first resistor part connected to the first and second terminals and forming resistance and a second resistor part connected to the second and third terminals and forming resistance, and the first resistor part and the second resistor part are formed integrally in a single layer.

2. The multi-terminal electronic component of claim 1, wherein the first through third terminals are not disposed on the first and second side surfaces of the base material.

3. The multi-terminal electronic component of claim 1, wherein the first and second side surfaces of the base material are entirely exposed.

4. The multi-terminal electronic component of claim 1, wherein the first terminal extends to a third side surface of the base material perpendicular with respect to the first and second side surfaces of the base material, and the second terminal extends to a fourth side surface of the base material opposing the third side surface of the base material.

5. The multi-terminal electronic component of claim 1, wherein the first resistor part and the second resistor part each determine a resistance level of one of the first and second resistor parts by trimming one of the first and second resistor parts based on a resistance level of the other of the first and second resistor parts determined through trimming.

6. A board having a multi-terminal electronic component, the board comprising:
   a circuit board on which first through third electrode pads are disposed; and
   a multi-terminal electronic component disposed on the circuit board,
   wherein the multi-terminal electronic component disposed on the circuit board includes a base material, a resistance layer disposed on a surface of the base material, a first terminal and a second terminal spaced apart from each other while covering portions of the resistance layer, respectively, and a third terminal disposed between the first terminal and the second terminal and covering a portion of the resistance layer,
   first and second side surfaces of the base material opposing each other are exposed from the first through third terminals, and
   a protection layer disposed on a surface of the resistance layer exposed from the first through third terminals,
   wherein the resistance layer includes a first resistor part connected to the first and second terminals and forming resistance and a second resistor art connected to the second and third terminals and forming resistance, and
   the first resistor part and the second resistor part are formed integrally in a single layer.

7. The board having a multi-terminal electronic component of claim 6, wherein the first through third terminals are not disposed on the first and second side surfaces of the base material.

8. The board having a multi-terminal electronic component of claim 6, wherein the first and second side surfaces of the base material are entirely exposed.

9. The board having a multi-terminal electronic component of claim 6, wherein the first terminal extends to a third side surface of the base material perpendicular with respect to the first and second side surfaces of the base material, and the second terminal extends to a fourth side surface of the base material opposing the third side surface of the base material.

10. The board having a multi-terminal electronic component of claim 6, wherein the first resistor part and the second resistor part each determine a resistance level of one of the first and second resistor parts by trimming one of the first and second resistor parts based on a resistance level of the other of the first and second resistor parts determined through trimming.

* * * * *